United States Patent [19]
Lin

[11] Patent Number: 5,801,093
[45] Date of Patent: Sep. 1, 1998

[54] PROCESS FOR CREATING VIAS USING PILLAR TECHNOLOGY

[75] Inventor: Yung-Fa Lin, Hsin-Chu, Taiwan

[73] Assignee: Taiwan Semiconductor Manufacturing Company, Ltd., Hsin-Chu, Taiwan

[21] Appl. No.: 663,573

[22] Filed: Jun. 13, 1996

[51] Int. Cl.$^6$ .................................................. H01L 21/44
[52] U.S. Cl. .......................... 438/624; 438/631; 438/669; 438/637
[58] Field of Search ........................... 438/624, 631, 438/645, 669, 637, 647

[56] References Cited

U.S. PATENT DOCUMENTS

| | | | |
|---|---|---|---|
| 4,917,759 | 4/1990 | Fisher et al. | 156/643 |
| 5,262,354 | 11/1993 | Cote et al. | 437/195 |
| 5,312,512 | 5/1994 | Allman et al. | 156/636 |
| 5,616,519 | 4/1997 | Ping. | |
| 5,639,692 | 6/1997 | Teong. | |
| 5,663,108 | 9/1997 | Lin. | |

*Primary Examiner*—Caridad Everhart
*Attorney, Agent, or Firm*—George O. Saile; Stephen B. Ackerman

[57] ABSTRACT

A process for creating metal pillar via structures, used to interconnect multilevel metallizations, has been developed. The process features the creation of a via hole, in a thin dielectric layer, exposing the top surface of an underlying first level metallization structure. The metal pillar via structure is next formed, contacting the first level metallization structure, exposed in the opened via hole in the thin dielectric layer. The spaces between the metal pillar via structures are filled with a composite dielectric material, featuring a spin on glass layer, which provides partial planarazation. The planarazation process is completed via a chemical mechanical polishing process, which also exposes the top surface of the metal pillar via structure, making the metal pillar via structure easily accessible for contact for subsequent, overlying metallization structures.

27 Claims, 5 Drawing Sheets

PROCESS FOR CREATING VIAS USING PILLAR TECHNOLOGY

BACKGROUND OF THE INVENTION

(1) Field of the Invention

This invention relates to methods used for the fabrication of semiconductor devices, and more specifically to processes used to create vias between interconnect metallization levels.

(2) Description of Prior Art

The semiconductor industry is continually striving to improve the performance of semiconductor devices, while still attempting to reduce the cost of these same devices. These objectives have been partially achieved by the trend to micro-miniaturazation, or the ability to produce semiconductor devices with sub-micron features. Significant advances in specific semiconductor fabrication disciplines, such as photolithography and reactive ion etching, have allowed micro-miniaturazation to occur. More sophisticated exposure cameras, as well as the development of more sensitive photoresist materials, have allowed sub-micron images to be created in photoresist layers. Similar advances in the dry etching discipline has resulted in the sub-micron images, in photoresist, being successfully defined in underlying materials, that are used for the fabrication of semiconductor devices.

The use of sub-micron features, can however, create new concerns, not encountered with devices fabricated with less aggressive groundrules. For example in order to maintain the conductivity requirement for sub-micron metal interconnects, the metal lines have to be thicker than for wider metal interconnect counterparts. In addition, the spaces between metal interconnects also decrease, subsequently resulting in difficulties when conventional passivation processes are used to fill these narrow spaces. Another area of concern is via formation, used to connect two levels of metal interconnects. Narrower via holes, used for sub-micron metallization processes, are more difficult to fill with the via metallization, than wider via counterparts that were previously used. These new problems, encountered when using sub-micron technologies, have been addressed. For example Allman, et al, in U.S. Pat. No. 5,312,512, and Fisher, et al, in U.S. Pat. No. 4,917,759, have described methods for filling narrow spaces between metal interconnects. However this invention will teach a fabrication sequence that allows a more complete solution for creating sub-micron vias, using a metal pillar approach, as well as an optimized process for filling the narrow spaces between the metal pillar vias.

SUMMARY OF THE INVENTION

It is an object of this invention to use a metal pillar, as a via, to connect an underlying metal interconnect level to an overlying metal interconnect level.

It is another object of this invention to use a thin dielectric layer as an etch stop layer for the metal pillar definition.

It is still another object of this invention to fill the narrow spaces between metal pillars with a composite dielectric, with one of the layers being a spin on glass material.

It is still yet another object of this invention to remove the composite dielectric, from the surface of the metal pillar, using chemical mechanical polishing.

In accordance with the present a method is described for forming vias, using a metal pillar, and using spin on glass and chemical mechanical polishing, for planarazation purposes. A first level metallization level is deposited and patterned, including contact to underlying device elements via an opened contact hole. Next a thin dielectric layer is deposited. A via hole is opened in the thin dielectric layer, followed by the deposition of a pillar metallization. The pillar metallization is patterned to form a metal pillar via, using the reverse of the mask previously used to open the via hole. A first plasma silicon oxide insulator is deposited, for purposes of passivating the metal pillar via. A spin on glass is than applied, filling the narrow spaces between pillar vias. After a bakeout and curing procedure, applied to remove volatile components from the spin on glass layer, a second plasma silicon oxide insulator is deposited, for purposes of encapsulating the spin on glass layer. Chemical mechanical polishing is next employed, to a point in which the top surface of the metal pillar vias are exposed. A second level metallization is deposited and patterned to create the second level metal structure, connected to the underlying first level metal structure by the metal pillar via.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming metal pillar via structures, and the passivation and planarazation processes used with the metal pillar via structures, will now be covered in detail. This invention can be used for metallization interconnects used for fabricating MOSFET devices currently being manufactured in industry. Therefore only the specific areas unique to understanding this invention will be described in detail.

Figure 1:
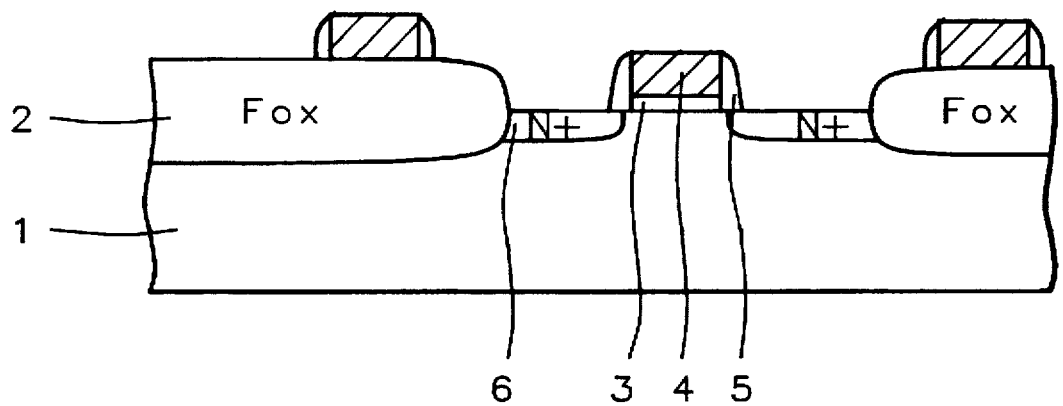
FIG. 1, which schematically, in cross-sectional style, shows a standard metal oxide semiconductor field effect transistor, (MOSFET), device, prior to metal pillar via, and interconnect metallization processing.

A typical N channel, MOSFET device, in which the metal pillar via structure, and accompanying passivation and planarazation processes, will be applied to, is shown in FIG. 1. A P type, single crystalline substrate, 1, with a <100> crystallographic orientation is, used. Thick field oxide, (FOX), regions, 2, are formed for purposes of isolation. Briefly the process for forming FOX regions is to use an oxidation mask, comprised of an overlying, chemically vapor deposited, silicon nitride layer, and an underlying thermally grown silicon dioxide layer. Conventional photolithographic and reactive ion etching, (RIE), procedures are used to pattern the composite dielectric oxidation mask. After photoresist removal and careful wet cleans, a thermal oxidation is performed at a temperature between about 800° to 1000° C., in an oxygen-steam ambient, to produce a FOX region between about 4000 to 6000 Angstroms, in unmasked areas. After removal of the composite dielectric oxidation mask, using hot phosphoric acid to remove the silicon nitride layer, and a buffered hydrofluoric acid solution to remove the underlying silicon dioxide layer, a silicon dioxide, gate insulator layer, 3, is thermally grown in an oxygen-steam ambient, at a temperature between about 800° to 1000° C., to a thickness between about 100 to 300 Angstroms. Next a polysilicon layer is deposited using low pressure chemical vapor deposition, (LPCVD), processing, at a temperature between about 600° to 800° C., to a thickness between about 2000 to 4000 Angstroms. The polysilicon layer is next subjected to an ion implantation of phosphorous, at an energy between about 50 to 100 Kev., at a dose between about 5E14 to 1E16 atoms/cm$^2$. Conventional photolithographic and RIE procedures, using $Cl_2$ as an etchant, are used to create the polysilicon gate structure, 4, schematically shown in FIG. 1. After photoresist removal, via plasma oxygen ashing, followed by careful wet cleans, a silicon oxide layer is deposited, using either LPCVD, or plasma enhanced chemical vapor deposition, (PECVD), processing. The silicon oxide layer is grown at a temperature between about 500° to 800° C., to a thickness between about 1000 to 4000 Angstroms, using tetraethylorthosilicate, (TEOS), as a source. A selective, anisotropic, RIE procedure, using $CHF_3$ as an etchant, is used to create insulator sidewall spacer, 5. An ion implantation of arsenic, at an energy between about 50 to 100 Kev., at a dose between about 5E13 to 5E14 atoms/cm$^2$, is used to create source and drain regions, 6, schematically shown in FIG. 1.

Figure 2:
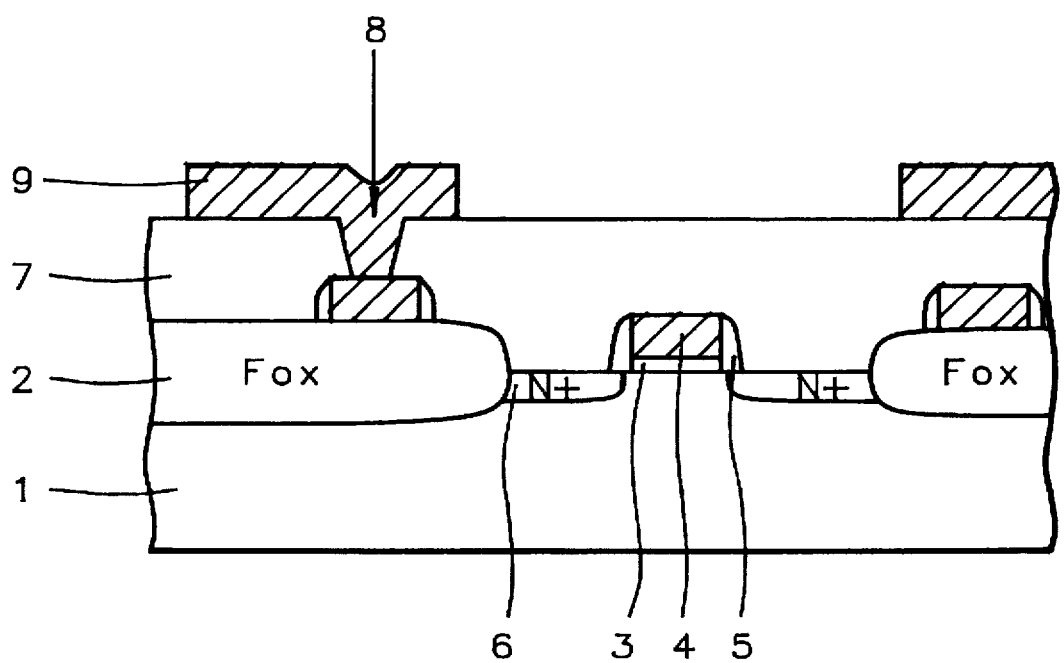
FIG. 2, which schematically, in cross-sectional style, shows the formation of a first level metal interconnect.

The process continues with the deposition of silicon oxide layer, 7, obtained via either LPCVD or PECVD processing, at a temperature between about 500° to 800° C., to a thickness between about 5000 to 8000 Angstroms. A contact hole, 8, is created in silicon oxide layer, 7, to expose polysilicon gate structure, 4. The contact hole, 8, is formed via conventional photolithographic and RIE procedures, using $CHF_3$ to etch silicon oxide layer, 7. Photoresist removal is accomplished via plasma oxygen ashing, followed by careful wet cleans. A deposition of aluminum, containing between about 1 to 3% copper, and between about 1 to 2% silicon, is performed using r.f. sputtering, to a thickness between about 4000 to 6000 Angstroms. Photolithographic and RIE procedures, using $Cl_2$ for the metal etchant, is performed to create first level metal structure, 9, shown schematically in FIG. 2, after photoresist removal, again accomplished using plasma oxygen ashing and careful wet cleans.

Figure 3:
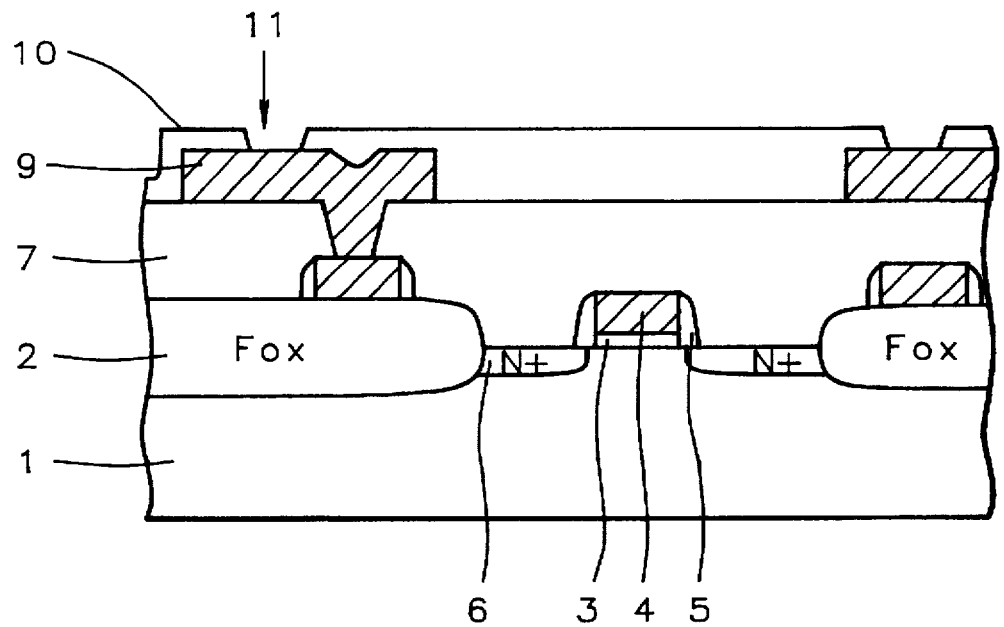
FIGS. 3–4, which schematically, in cross-sectional style, shows the formation of the metal pillar via structure.
Figure 4:
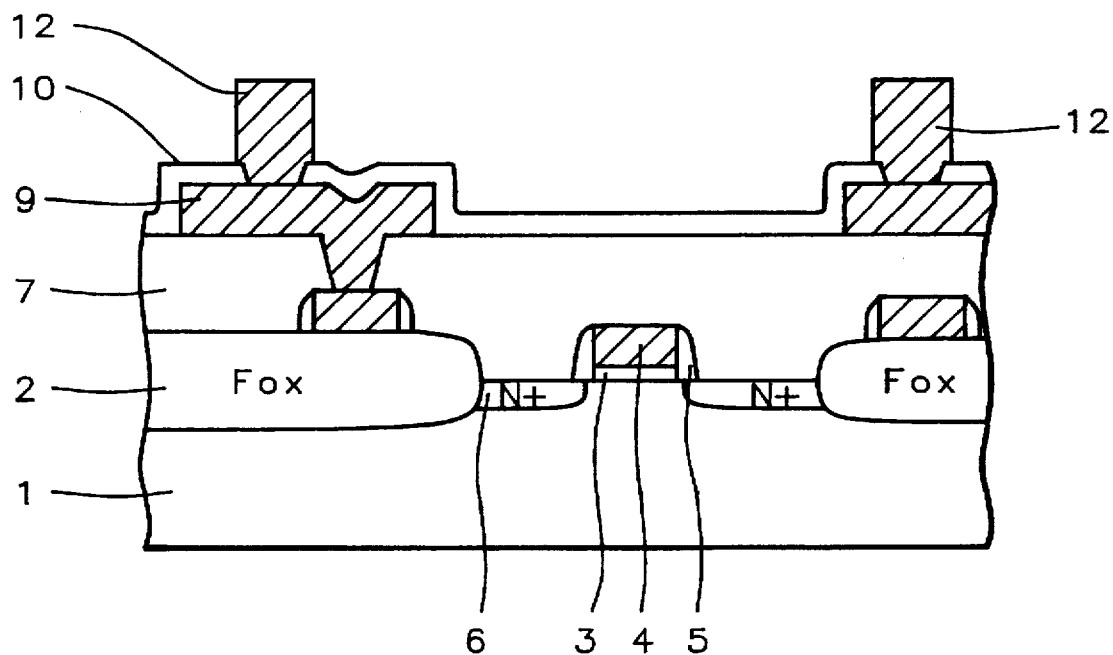

A thin dielectric layer of silicon oxide, 10, to be used as a metal etch stop layer, is deposited using PECVD processing, at a temperature between about 400° to 600° C., to a thickness between about 500 to 1000 Angstroms. A via hole, 11, is next formed in the silicon oxide, metal etch stop layer, 10, using conventional photolithographic and RIE procedures. The RIE etchant used to create via hole, 11, is $CHF_3$. This is shown in FIG. 3, after photoresist removal, using plasma oxygen ashing, followed by wet cleans. The metallization needed to create the metal pillar via structure is next performed. A deposition of aluminum, containing between about 1 to 3% copper, is made using r.f. sputtering, to a thickness between about 4000 to 6000 Angstroms. Another option is to use LPCVD tungsten for the metal pillar via structure, deposited to a thickness between about 4000 to 6000 Angstroms. If tungsten is desired it is necessary to initially deposit underlying adhesive and barrier layers of titanium, and titanium nitride, via r.f. sputtering, prior to deposition of tungsten. The titanium layer is deposited to a thickness between about 300 to 500 Angstroms, while the titanium nitride layer is deposited to a thickness between about 500 to 1000 Angstroms. Photolithography, using the reverse of the mask previously used to define via hole, 11, is now used to define the photoresist image used for metal pillar via formation. The creation of metal pillar via structure, 12, is achieved using selective, anisotropic, RIE processing, using $Cl_2$ as an etchant for either the aluminum based metallurgy, or the tungsten based metallurgy. The metal pillar via structure, 12, is shown schematically in FIG. 4, after photoresist removal, using plasma oxygen ashing and careful wet cleans. The importance of etch stop, silicon oxide layer, 10, can be seen, allowing the selective $Cl_2$ etching to successfully remove residual metal, without damaging first level metal structure, 9.

Figure 5:
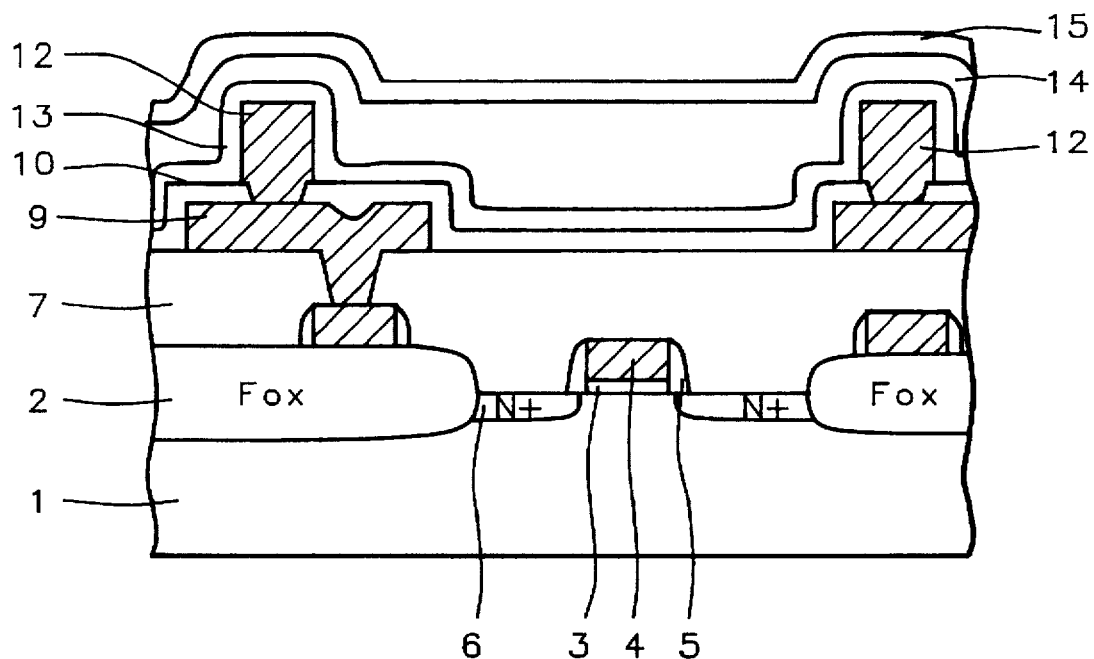
FIGS. 5–6, which schematically, in cross-sectional style, shows the process stages of passivation, and planarazation, used with the construction of metal pillar via structures.

A composite dielectric is next deposited, shown in FIG. 5, initiating with a first plasma silicon oxide insulator, 13, obtained using PECVD processing, at a temperature between about 400° to 600° C., to a thickness between about 2000 to 4000 Angstroms. This insulator layer provides passivation for metal pillar via structure, 12, without however filling the spaces between metal pillar via structures. Next a spin on glass, (SOG), material, 14, is applied using siloxane, to a thickness between about 6000 to 10000 Angstroms. This material is used to roughly planarize the existing topography by filling the spaces between metal pillars. The SOG material is subjected to a bake out at a temperature between about 200° to 300° C., using a hot plate, as well as a curing process, performed at a temperature between about 300° to 400° C. These treatments are performed to the SOG material for purposes of removing volatile components, that would otherwise outgas during subsequent temperature excursions, deleteriously influencing surrounding, exposed metal structures. Finally a second plasma silicon oxide insulator, 15, is deposited using PECVD processing, at a temperature between about 400° to 600° C., to a thickness between about 6000 to 10000 Angstroms. The plasma silicon oxide insulator, 15, is used to encapsulate most of the underlying SOG material, 14, offering additional protection in terms of possible SOG outgassing.

Figure 6:
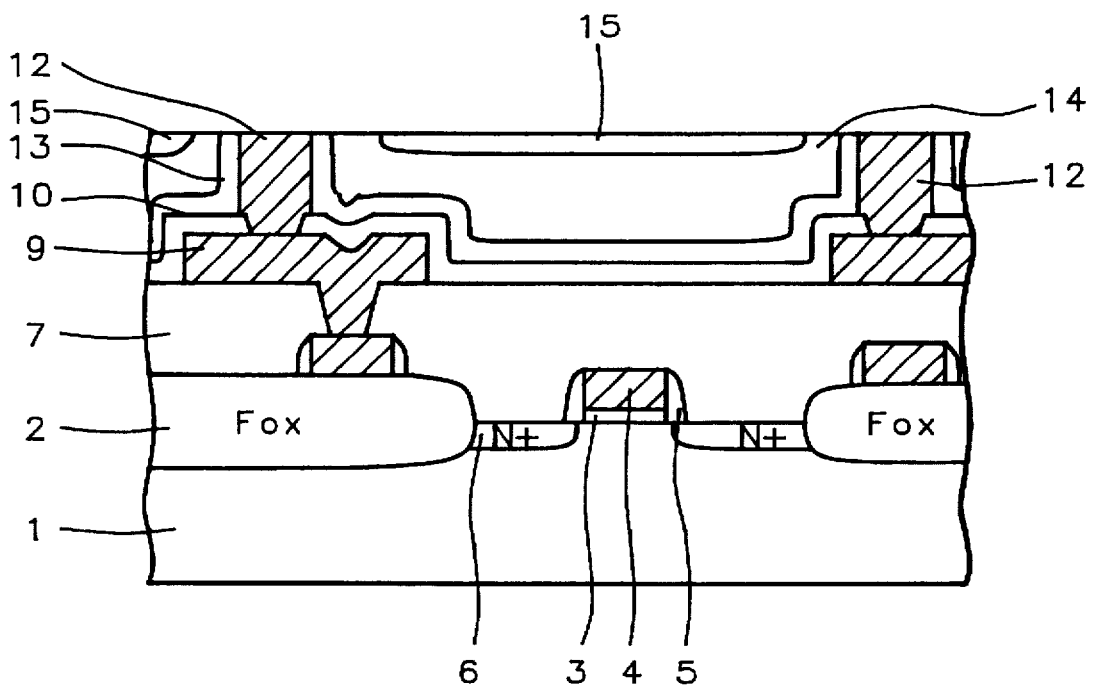
Figure 7:
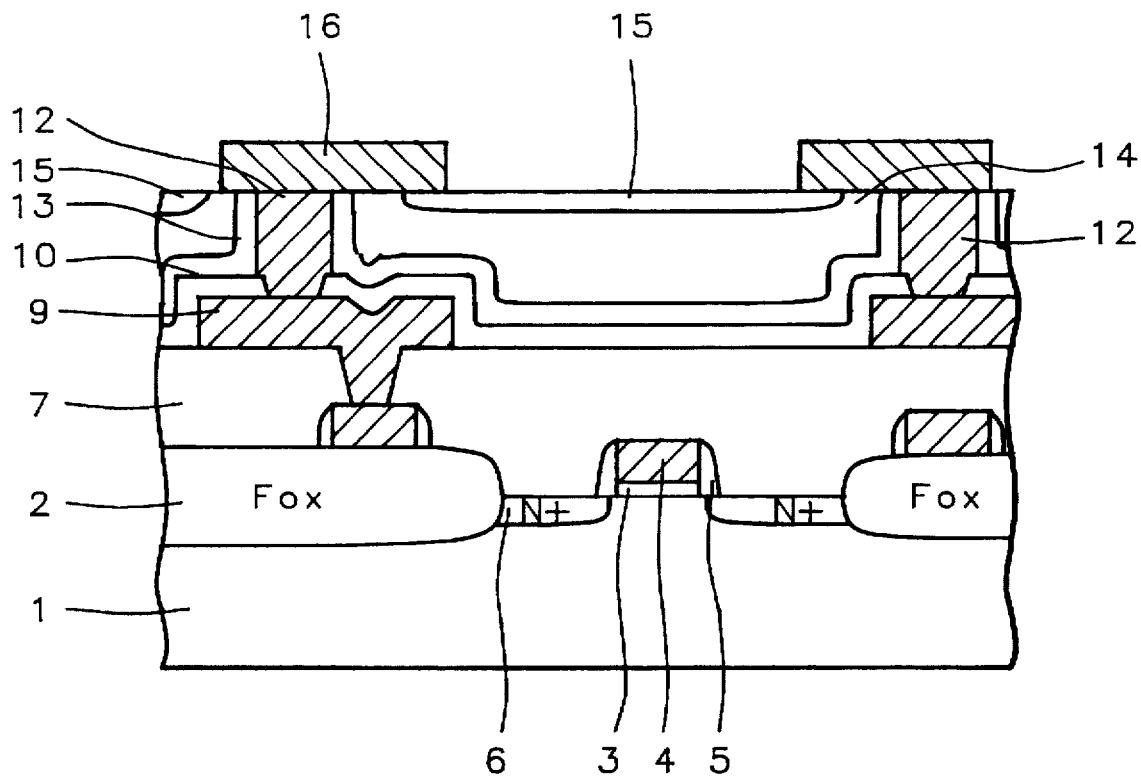
FIG. 7, which schematically, in cross-sectional style, shows the formation of a second level metal interconnect.

FIG. 6, shows the result of a chemical mechanical planarazation, (CMP), step, performed to remove composite dielectric material to a point where the top surface of metal pillar via structures, 12, are exposed. A second level metallization, of aluminum, containing about 1 to 3% copper, is next performed via r.f. sputtering, to a thickness between about 5000 to 1000 Angstroms. Conventional photolithographic and RIE processes, using $Cl_2$ as an etchant, are used to create second level metal structure, 16, shown schematically in FIG. 7. Photoresist removal is once again accomplished using plasma oxygen ashing, followed by careful wet cleans.

Figure 8:
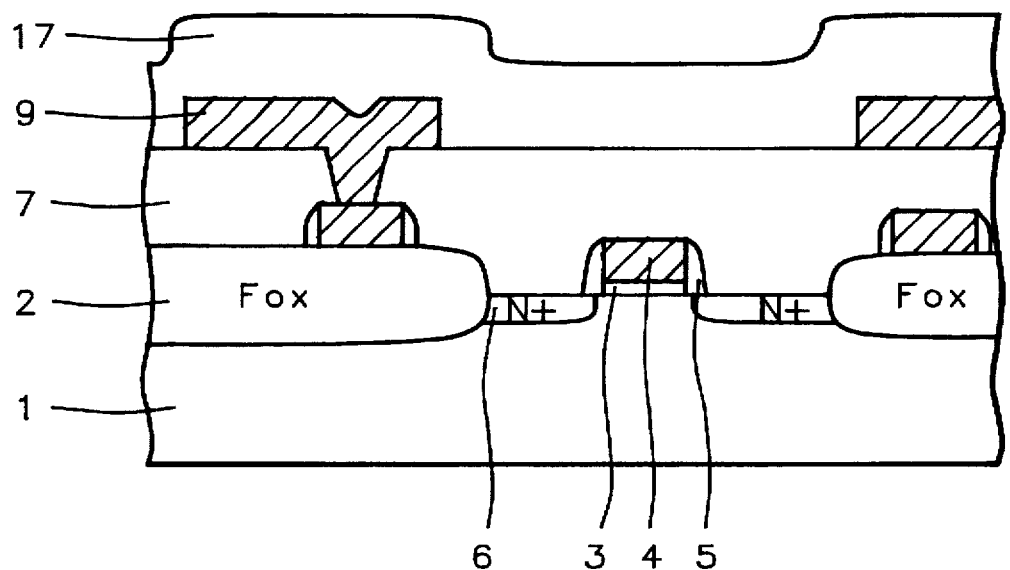
FIGS. 8–9, which schematically, in cross-sectional style, describe a second embodiment, used to planarize a first level metal interconnect and the passivating insulator, prior to the creation of the metal pillar via structures.
Figure 9:
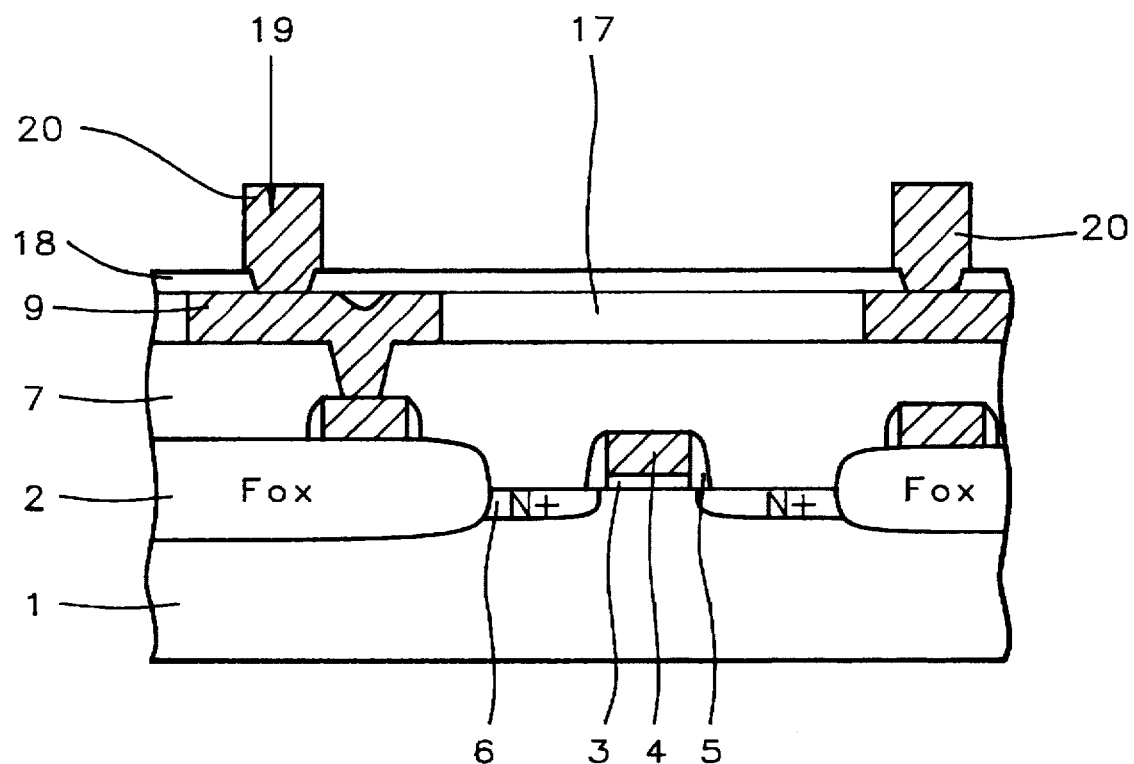

Another iteration can be employed in which a planarazation process is applied to the first level metal structure, 9. This can be accomplished by a deposition of a plasma silicon oxide layer, 17, obtained via PECVD processing, at a temperature between about 400° to 600° C., to a thickness between about 8000 to 12000 Angstroms. This is shown schematically in FIG. 8. A CMP planarazation procedure is next performed, to a point where the surface of first level metal structure 9, is exposed. A thin dielectric layer of silicon oxide, 18, is next deposited on planarized surface, using PECVD processing, at a temperature between about 400° to 600° C., to a thickness between about 500 to 1000 Angstroms. The remaining processes are identical to those previously shown, such as a via hole 19, creation in silicon oxide layer, 18, to expose underlying first level metal structure, 9, and the formation of metal pillar via structures, 20. This is shown schematically in FIG. 9. The deposition of the composite dielectric, planarazation, via CMP, and creation of a second level metal structure, is again identical to structures and processes previously described. However the ability to initially planarize the first level metal structures, reduces the complexity of the second planarazation step, performed prior to second level metallization.

This process for creating vias using metal pillar structures, and SOG for filling the spaces between metal pillar structures, although shown as part of an N channel, (NFET), MOSFET device, can also be used for the fabrication of a P channel, (PFET), MOSFET device, a BiCMOS device, as well as for bipolar devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using metal pillar via structures, and spin on glass to fill the spaces between said metal pillar structures, comprising the steps of:

providing an element of said MOSFET device;

depositing an insulator layer on said semiconductor substrate, including on said element of said MOSFET device;

opening a contact hole in said insulator layer, to said element of said MOSFET device;

deposition of a first metallization layer on said on said insulator layer, and on exposed top surface of said element of said MOSFET device, in said contact hole;

patterning of said first metallization layer to form first level metallization structure, providing contact to underlying, said element of said MOSFET device;

depositing a dielectric layer on said first level metallization structure, and on said insulator layer, not covered by first level metallization structure;

opening a via hole in said dielectric layer to expose surface of said first level metallization structure;

deposition of a second metallization layer on said dielectric layer, and on exposed top surface of said first level metallization structure, in said via hole;

patterning of said second metallization layer to form said metal pillar via structure, providing contact to underlying, said first level metallization structure;

depositing a first plasma insulator layer on said metal pillar via structure, and on said dielectric layer, not covered by said metal pillar via structure;

application of a spin on glass layer on said first plasma insulator layer, filling the spaces between said metal pillar via structures;

baking of said spin on glass layer;

curing of said spin on glass layer;

depositing a second plasma insulator layer on said spin on glass layer;

chemical mechanical polishing to expose top surface of said metal pillar via structure by removal of said second plasma insulator layer, of said spin on glass layer, and of said first plasma insulator layer, from top surface of said metal pillar via structure, while leaving said second plasma insulator layer, said spin on glass layer, and said first plasma insulator layer, in spaces between said metal pillar structures;

deposition of a third metallization layer on exposed top surface of said metal pillar via structure, and on exposed top surfaces of said second plasma insulator layer, of said spin on glass layer, and of said first plasma insulator layer, in spaces between said metal pillar via structures; and patterning of said third metallization layer to form second level metallization structure, contacting underlying, said metal pillar via structure.

2. The method of claim 1, wherein said element, of said MOSFET device, is a polysilicon gate structure.

3. The method of claim 1, wherein said first metallization layer is aluminum, containing about 1 to 3% copper, and between about 1 to 2% silicon, deposited using r.f. sputtering, to a thickness between about 4000 to 6000 Angstroms.

4. The method of claim 1, wherein said dielectric layer is silicon oxide, deposited using PECVD processing, at a temperature between about 400° to 600° C., to a thickness between about 500 to 1000 Angstroms.

5. The method of claim 1, wherein said via hole is created using RIE processing, using $CHF_3$ as an etchant.

6. The method of claim 1, wherein said second metallization layer, used for said metal pillar via structure formation, is aluminum, containing between about 1 to 3% copper, deposited using r.f. sputtering, to a thickness between about 4000 to 6000 Angstroms.

7. The method of claim 1, wherein said second metallization layer, used for said metal pillar via structure formation is: an adhesive layer of titanium, r.f. sputtered to a thickness between about 300 to 500 Angstroms; a barrier layer of titanium nitride, r.f. sputtered to a thickness between about 500 to 1000 Angstroms; and a layer of tungsten, obtained via LPCVD processing, to a thickness between about 4000 to 6000 Angstroms.

8. The method of claim 1, wherein said first plasma insulator is silicon oxide, deposited using PECVD processing, at a temperature between about 400° to 600° C., to a thickness between about 2000 to 4000 Angstroms.

9. The method of claim 1, wherein said spin on glass layer is applied to a thickness between about 6000 to 10000 Angstroms, using siloxane.

10. The method of claim 1, wherein said spin on glass layer is baked at a temperature between about 200° to 300° C., and cured at a temperature between about 300° to 400° C.

11. The method of claim 1, wherein said second plasma insulator is silicon oxide, deposited using PECVD processing, at a temperature between about 400° to 600° C., to a thickness between about 6000 to 10000 Angstroms.

12. The method of claim 1, wherein said chemical mechanical polishing procedure is performed to expose the top surface of said metal pillar via structure.

13. The method of claim 1, wherein said third metallization layer is aluminum, containing between about 1 to 3% copper, deposited using r.f. sputtering, to a thickness between about 5000 to 10000 Angstroms.

14. A method for fabricating a MOSFET device, on a semiconductor substrate, using metal pillar via structures, and spin on glass to fill the spaces between said metal pillar via structures, comprising the steps of:

providing a polysilicon gate structure on said MOSFET device;

depositing a first insulator layer on said semiconductor substrate, including on said polysilicon gate structure of said MOSFET device;

opening a contact hole in said insulator layer, to said polysilicon gate structure;

deposition of a first metallization layer on said insulator layer, and on exposed top surface of said polysilicon gate structure, in said contact hole;

patterning of said first metallization layer to form first level metallization structure, providing contact to underlying, said polysilicon gate structure;

depositing a second insulator layer on said first level metallization structure, and on underlying said first insulator layer, not covered by said first level metallization structure;

a first chemical mechanical polishing procedure to expose top surface of said first level metallization structure, by removal of said second insulator from top surface of said first metallization structure, while leaving said second insulator layer in spaces between said first metallization structures;

depositing a dielectric layer on said first metallization structure, and on said second insulator layer, in spaces between said first level metallization structures;

opening a via hole in said dielectric layer to expose surface of said first level metallization structure;

deposition of a second metallization layer on said dielectric layer, and on exposed surface of said first level metallization structure, in said via hole;

patterning of said second metallization layer to form said metal pillar via structure, providing contact to underlying, said first level metallization structure;

depositing a first plasma insulator layer on said metal pillar via structure, and on said dielectric layer, not covered by said metal pillar via structure;

application of a spin on glass layer on said first plasma insulator layer, filling the spaces between said metal pillar via structures;

baking of said spin on glass;

curing of said spin on glass;

depositing a second plasma insulator on said spin on glass layer;

a second chemical mechanical procedure to expose top surface of said metal pillar via structure by removal of said second plasma insulator layer, of said spin on glass layer, and of said first plasma insulator layer, from top surface of said metal pillar via structure, while leaving said second plasma insulator layer, said spin on glass layer, and said first plasma insulator layer, in spaces between said metal pillar via structures;

deposition of a third metallization layer on exposed top surface of said metal pillar via structure, and on exposed top surfaces of said second plasma insulator layer, of said spin on glass layer, and on said first plasma insulator layer, in spaces between said metal pillar via structures; and patterning of said third metallization layer to form second level metallization structure, contacting underlying, said metal pillar via structure.

15. The method of claim 14, wherein said first metallization layer is aluminum, containing between about 1 to 3% copper, and between about 1 to 2% silicon, deposited using r.f. sputtering, to a thickness between about 4000 to 6000 Angstroms.

16. The method of claim 14, wherein said second insulator layer is silicon oxide, deposited using PECVD processing, at a temperature between about 400° to 600° C., to a thickness between about 8000 to 12000 Angstroms.

17. The method of claim 14, wherein said first chemical mechanical polishing procedure is performed using an oxide chemical mechanical polishing procedure.

18. The method of claim 14, wherein said dielectric layer is silicon oxide, deposited using PECVD processing, at a temperature between about 400° to 600° C., to a thickness between about 500 to 1000 Angstroms.

19. The method of claim 14, wherein said via hole is created using RIE processing, using $CHF_3$ as an etchant.

20. The method of claim 14, wherein said second metallization layer, used for said metal pillar via structure formation, is aluminum, containing between about 1 to 3% copper, deposited using r.f. sputtering, to a thickness between about 4000 to 6000 Angstroms.

21. The method of claim 14, wherein said second metallization layer, used for said metal pillar via structure formation is: an adhesive layer of titanium, r.f. sputtered to a thickness between about 300 to 500 Angstroms; a barrier layer of titanium nitride, r.f. sputtered to a thickness between about 500 to 1000 Angstroms; and a layer of tungsten, obtained via LPCVD processing, to a thickness between about 4000 to 6000 Angstroms.

22. The method of claim 14, wherein said first plasma insulator layer is silicon oxide, deposited using PECVD processing, at a temperature between about 400° to 600° C., to a thickness between about 2000 to 4000 Angstroms.

23. The method of claim 14, wherein said spin on glass layer is applied using siloxane, to a thickness between about 6000 to 10000 Angstroms.

24. The method of claim 14, wherein said spin on glass layer is baked at a temperature between about 200° to 300° C., and cured at a temperature between about 300° to 400° C.

25. The method of claim 14, wherein said second plasma insulator layer is silicon oxide, deposited using PECVD processing, at a temperature between about 400° to 600° C., to a thickness between about 6000 to 10000 Angstroms.

26. The method of claim 14, wherein said second chemical mechanical polishing procedure is performed to expose the top surface of said metal pillar via structure.

27. The method of claim 14, wherein said third metallization layer is aluminum, containing between about 1 to 3% copper, deposited using r.f. sputtering, to a thickness between about 5000 to 10000 Angstroms.

* * * * *